United States Patent
Song

(10) Patent No.: US 12,302,536 B2
(45) Date of Patent: May 13, 2025

(54) COOLING SYSTEM AND DATA CENTER

(71) Applicant: Huawei Digital Power Technologies Co., Ltd., Shenzhen (CN)

(72) Inventor: Jinliang Song, Xi'an (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 207 days.

(21) Appl. No.: 17/988,561

(22) Filed: Nov. 16, 2022

(65) Prior Publication Data

US 2023/0156975 A1    May 18, 2023

(30) Foreign Application Priority Data

Nov. 18, 2021   (CN) .......................... 202122841225.8

(51) Int. Cl.
G06F 1/16       (2006.01)
H05K 5/00       (2006.01)
H05K 7/00       (2006.01)
H05K 7/20       (2006.01)

(52) U.S. Cl.
CPC ..... H05K 7/20781 (2013.01); H05K 7/20236 (2013.01); H05K 7/20272 (2013.01)

(58) Field of Classification Search
CPC .......... H05K 7/20781; H05K 7/20236; H05K 7/20272; H05K 7/20763; H05K 7/208; H05K 7/20818; H05K 7/20263; H05K 7/20218
See application file for complete search history.

(56) References Cited

U.S. PATENT DOCUMENTS

| | | | | |
|---|---|---|---|---|
| 2019/0166726 A1* | 5/2019 | Tung | ........................ | G01F 25/10 |
| 2021/0219454 A1* | 7/2021 | Cheng | ................ | H05K 7/20318 |
| 2021/0289662 A1* | 9/2021 | Tung | ................. | H05K 7/20327 |
| 2022/0338376 A1* | 10/2022 | Tan | ..................... | H05K 7/20318 |
| 2022/0369504 A1* | 11/2022 | Clerc | ................. | H05K 7/20236 |
| 2023/0045342 A1* | 2/2023 | Wang | ................. | H05K 7/20818 |
| 2023/0189476 A1* | 6/2023 | Wu | ..................... | H05K 7/20263 |
| | | | | 361/699 |

FOREIGN PATENT DOCUMENTS

| | | |
|---|---|---|
| CN | 106465561 A | 2/2017 |
| CN | 112739182 A | 4/2021 |
| WO | 2016011186 A1 | 1/2016 |

* cited by examiner

*Primary Examiner* — Anthony M Haughton
(74) *Attorney, Agent, or Firm* — SLATER MATSIL, LLP

(57) ABSTRACT

A cooling system, including at least one liquid cooling module unit, where each liquid cooling module unit includes a liquid storage vessel, and a heat exchange capsule. The liquid storage vessel is configured to store a first cooling medium, the heat exchange capsule is in the liquid storage vessel, at least a part of the heat exchange capsule is arranged to be immersed, in use, in the first cooling medium, the heat exchange capsule is configured to store a second cooling medium, and the first cooling medium is configured to exchange heat with the second cooling medium.

17 Claims, 2 Drawing Sheets

COOLING SYSTEM AND DATA CENTER

CROSS-REFERENCE TO RELATED APPLICATION

This application claims priority to Chinese Patent Application No. 202122841225.8, filed on Nov. 18, 2021, which is hereby incorporated by reference in its entirety.

TECHNICAL FIELD

This application relates to the field of cooling technologies, and in particular, to a cooling system and a data center.

BACKGROUND

With rapid advancement of big data, an industrial scale of a data center rapidly expands. A cooling system of the data center is configured to cool and dissipate heat for a device of the data center. In a conventional liquid-cooled cooling system, a plurality of load devices (for example, servers) are installed in one tank, there is coolant in the tank, and the plurality of devices are immersed in the coolant. However, efficiency of the cooling system is relatively low, and therefore it is difficult to meet a current data center with a relatively high power density.

UTILITY MODEL CONTENT

Embodiments of this application provide a cooling system and a data center that can improve cooling efficiency.

According to a first aspect, this application provides a cooling system, including at least one liquid cooling module unit. Each liquid cooling module unit includes a liquid storage vessel and a heat exchange capsule, the liquid storage vessel is configured to store a first cooling medium, the heat exchange capsule is accommodated in the liquid storage vessel, at least a part of the heat exchange capsule can be immersed in the first cooling medium, the heat exchange capsule is configured to store a second cooling medium, and the first cooling medium is configured to exchange heat with the second cooling medium.

The heat exchange capsule is configured to carry a to-be-cooled load, and the to-be-cooled load is immersed in the second cooling medium in the heat exchange capsule. The to-be-cooled load generates heat when working. The second cooling medium absorbs the heat generated by the to-be-cooled load when the to-be-cooled load works, and a temperature of the second cooling medium increases. Because the heat exchange capsule is accommodated in the liquid storage vessel and immersed in the first cooling medium in the liquid storage vessel, the first cooling medium exchanges heat with the second cooling medium and absorbs heat of the second cooling medium, so that the first cooling medium cools the second cooling medium. When the second cooling medium cools and dissipates heat for the to-be-cooled load, the first cooling medium cools the second cooling medium, thereby helping improve cooling efficiency of the cooling system. The first cooling medium is placed in the liquid storage vessel, and the second cooling medium is placed in the beat exchange capsule, thereby helping reduce a usage amount of the first cooling medium and a usage amount of the second cooling medium.

For example, cooling water with low costs may be selected as the first cooling medium, and cooling liquid (for example, fluorinated liquid) with relatively high costs and a relatively good cooling effect may be selected as the second cooling medium. In this way, usage costs of the cooling system can be reduced.

There is at least one heat exchange capsule in each liquid cooling module unit.

In addition, the liquid cooling module unit uses a modular design, to facilitate transportation and deployment, thereby effectively shortening a deployment period. When the cooling system and a data center need to be scaled down or scaled up, it is only necessary to reduce or increase a quantity of liquid cooling module units.

According to the first aspect of this application, in a first possible implementation of this application, the heat exchange capsule includes a capsule body and a connection interface disposed in the capsule body, the capsule body is configured to store the second cooling medium, and the connection interface is configured to be electrically connected to the to-be-cooled load immersed in the second cooling medium, thereby facilitating assembly and disassembly of the to-be-cooled load.

According to the first aspect of this application or the first possible implementation of this application, in a second possible implementation of this application, the cooling system further includes a control unit, and the control unit is electrically connected to the connection interface, thereby facilitating power distribution and monitoring of the to-be-cooled load.

According to the first aspect of this application or the first and the second possible implementations of this application, in a third possible implementation of this application, the cooling system further includes a recycling unit, and the recycling unit is connected to the liquid storage vessel by using pipelines and is configured to recycle a first cooling medium flowing out of the liquid storage vessel.

According to the first aspect of this application or the first to the third possible implementations of this application, in a fourth possible implementation of this application, the liquid storage vessel includes a liquid inlet and a liquid outlet, the recycling unit includes a heat storage region and a cold storage region that are separately disposed, the heat storage region is connected to the liquid outlet of the liquid storage vessel by using a pipeline, the heat storage region is configured to store the first cooling medium flowing out of the liquid outlet of the liquid storage vessel, the cold storage region is connected to the liquid inlet of the liquid storage vessel by using a pipeline, the cold storage region is configured to store a first cooling medium, and a temperature of the first cooling medium in the heat storage region is higher than a temperature of the first cooling medium in the cold storage region.

The first cooling medium flowing out of the liquid outlet of the liquid storage vessel becomes a hot first cooling medium due to a temperature increase caused by heat exchange with the second cooling medium. The heat storage region stores the hot first cooling medium flowing out of the liquid outlet of the liquid storage vessel, so that excess heat of the liquid cooling module unit can be effectively recycled, thereby saving energy. The cold storage region is configured to supplement the liquid storage vessel with the first cooling medium.

According to the first aspect of this application or the first to the fourth possible implementations of this application, in a fifth possible implementation of this application, the recycling unit is a recycling vessel, the heat storage region and the cold storage region are disposed in a height direction of the recycling vessel, and the cold storage region is located at a bottom of the recycling vessel.

The heat storage region for heat storage and the cold storage region for cold storage are disposed in the same vessel, thereby simplifying a structure of the cooling system. The heat storage region and the cold storage region are stacked in the height direction of the recycling unit, thereby effectively reducing a floor area of the recycling unit, and improving space utilization of the cooling system.

According to the first aspect of this application or the first to the fifth possible implementations of this application, in a sixth possible implementation of this application, the heat storage region includes a liquid inlet and a liquid outlet, the liquid inlet of the heat storage region is connected to the liquid outlet of the liquid storage vessel, the liquid outlet of the heat storage region is located at an end that is of the heat storage region and that is away from the cold storage region, and a valve is disposed at the liquid outlet of the heat storage region and is configured to open or close the liquid outlet of the heat storage region, thereby facilitating obtaining of the hot first cooling medium. The first cooling medium is layered with temperatures in a height direction of the heat storage region. For example, a first cooling medium with a highest temperature is located at an uppermost layer. The liquid outlet is disposed at a relatively high position in the height direction of the beat storage region, so that a first cooling medium flowing out of the liquid outlet always keeps at an optimal heat recycling temperature.

According to the first aspect of this application or the first to the sixth possible implementations of this application, in a seventh possible implementation of this application, the recycling unit further includes a bypass component disposed between the heat storage region and the cold storage region, and the bypass component is configured to transport the first cooling medium in the heat storage region to the cold storage region, to adjust the temperature of the first cooling medium in the cold storage region, thereby adapting to different temperature requirements of the first cooling medium.

According to the first aspect of this application or the first to the seventh possible implementations of this application, in an eighth possible implementation of this application, the liquid storage vessel includes a liquid inlet and a liquid outlet, the recycling unit includes a cooling tower and/or a dry cooler, the recycling unit is connected to the liquid inlet of the liquid storage vessel, the recycling unit is connected to the liquid outlet of the liquid storage vessel, and the recycling unit is configured to: cool the first cooling medium flowing out of the liquid outlet of the liquid storage vessel, and transport a cooled first cooling medium to the liquid storage vessel from the liquid inlet of the liquid storage vessel, so that the first cooling medium is cyclically used, thereby reducing a usage amount of the first cooling medium.

According to the first aspect of this application or the first to the eighth possible implementations of this application, in a ninth possible implementation of this application, the cooling system further includes a pump disposed on the pipeline between the recycling unit and the liquid storage vessel, and the pump is configured to drive the first cooling medium in the liquid storage vessel to the recycling unit, thereby improving working efficiency of the cooling system.

A second aspect of this application provides a data center, including the cooling system according to the first aspect of this application or the first to the ninth possible implementations of this application and a to-be-cooled load. The to-be-cooled load is accommodated in the heat exchange capsule and can be immersed in the second cooling medium.

DESCRIPTION OF EMBODIMENTS

In a conventional data center cooling system, in particular, a direct expansion refrigeration system or a system that partially performs refrigeration through direct expansion, energy efficiency is limited by a system component, and therefore a requirement of power usage effectiveness (power usage effectiveness, PUE) of a data center cannot be met. There is also a liquid-cooled cooling system in which a plurality of load devices (for example, servers) are installed in one tank, there is coolant in the tank, and the plurality of devices are immersed in the coolant. However, efficiency of the cooling system is relatively low, and therefore it is difficult to meet a current data center with a relatively high power density.

Based on this, this application provides a cooling system and a related data center thereof, to improve cooling efficiency. The cooling system includes at least one liquid cooling module unit. Each liquid cooling module unit includes a liquid storage vessel and a heat exchange capsule, the liquid storage vessel is configured to store a first cooling medium, the heat exchange capsule is accommodated in the liquid storage vessel, at least a part of the heat exchange capsule can be immersed in the first cooling medium, the heat exchange capsule is configured to store a second cooling medium, and the first cooling medium is configured to exchange heat with the second cooling medium.

The following further describes the cooling system and the related data center thereof with reference to specific implementations and accompanying drawings.

Figure 1:
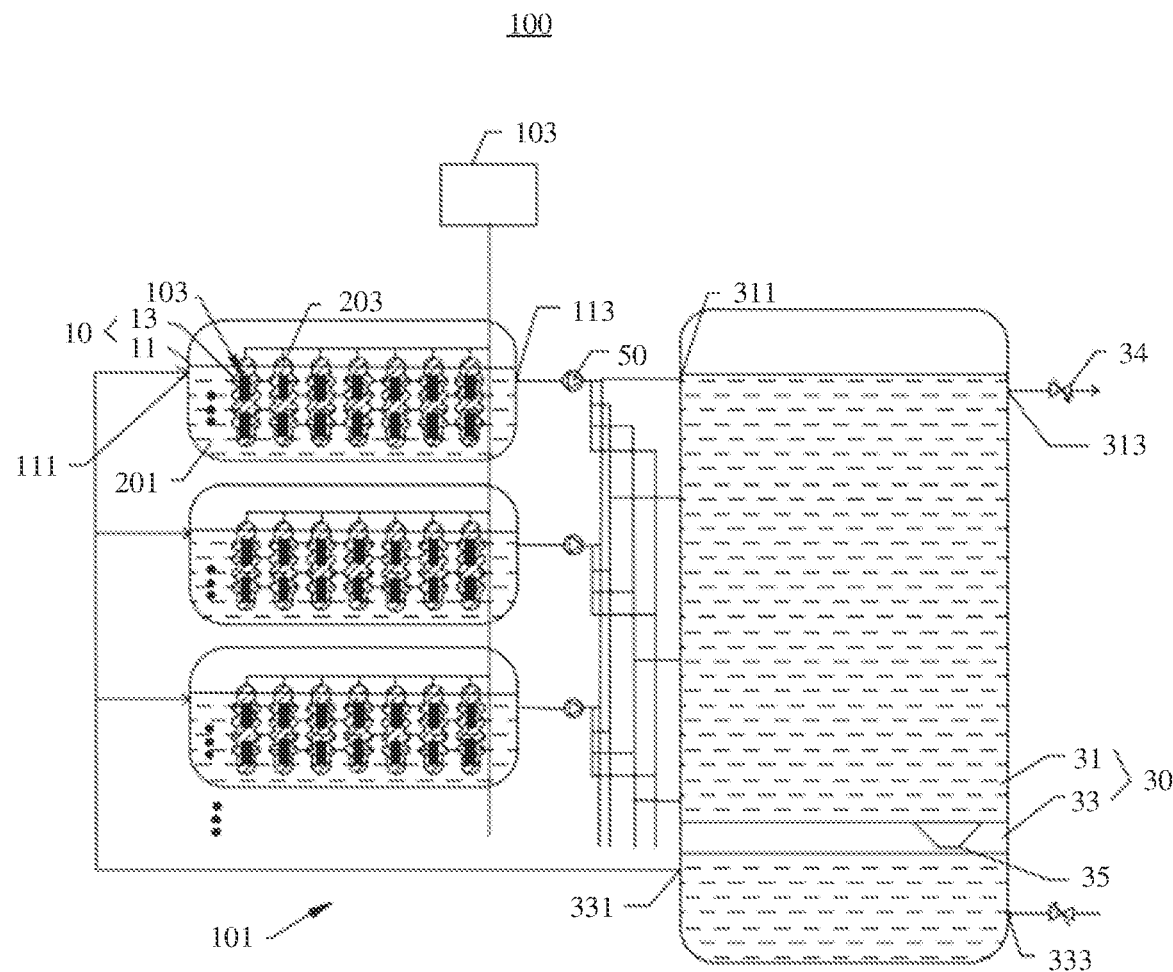
FIG. 1 is a schematic diagram of a data center according to a first implementation of this application.
Figure 2:
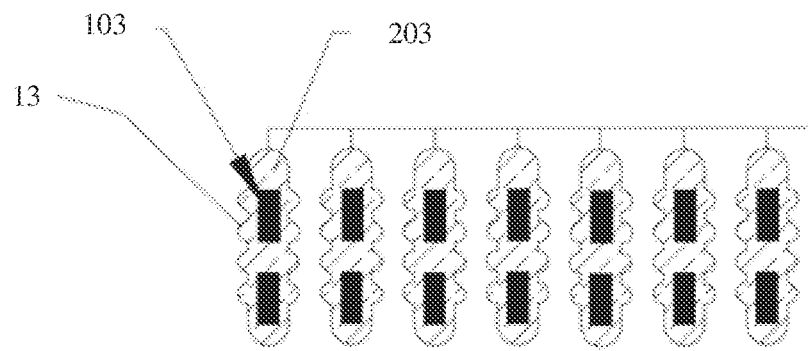
FIG. 2 is an enlarged schematic diagram of assembling a liquid cooling module unit and a to-be-cooled load together.

Referring to FIG. 1 and FIG. 2, a first implementation of this application provides a data center 100, configured to transfer, accelerate, display, calculate, and store data information. The data center 100 includes a cooling system 101 and a to-be-cooled load 103. The cooling system 101 is configured to cool and dissipate heat for the to-be-cooled load 103. The to-be-cooled load 103 includes a server, a power distribution device, or the like. Details are not described herein.

The cooling system 101 includes a liquid cooling module unit 10 and a recycling unit 30 that are disposed through pipeline connection. The liquid cooling module unit 10 is configured to cool and dissipate heat for the to-be-cooled load 103. The recycling unit 30 is configured to recycle a cooling medium flowing out of the liquid cooling module unit 10.

The liquid cooling module unit 10 includes a liquid storage vessel 11 and a heat exchange capsule 13.

The liquid storage vessel 11 is configured to store a first cooling medium 201. The liquid storage vessel 11 may be a tank, such as a horizontal fuel tank, to facilitate assembly and transportation. The horizontal fuel tank is usually a long vessel configured to store crude oil, vegetable oil, a chemical solvent, water, or other petroleum products. The horizontal fuel tank usually includes an end cover, horizontal round or oval tank walls, and a saddle. It may be understood that a shape of the horizontal fuel tank may be alternatively an irregular shape. The liquid storage vessel 11 may be alternatively a container. A liquid inlet 111 and a liquid outlet 113 are disposed in the liquid storage vessel 11. The liquid inlet 111 is configured to input the first cooling medium 201. The liquid outlet 113 is configured to output the first cooling medium 201.

The heat exchange capsule 13 is accommodated in the liquid storage vessel 11. At least a part of the heat exchange capsule 13 can be immersed in the first cooling medium 201 in the liquid storage vessel 11. The heat exchange capsule 13 is configured to accommodate a second cooling medium 203 and the to-be-cooled load 103. At least a part of the to-be-cooled load 103 is immersed in the second cooling medium 203 in the heat exchange capsule 13. The second cooling medium 203 is configured to cool and dissipate heat for the to-be-cooled load 103. The first cooling medium 201 is configured to exchange heat with the second cooling medium 203, to cool and dissipate heat for the second cooling medium 203.

When the cooling system 101 is used, the to-be-cooled load 103 is immersed in the second cooling medium 203. The second cooling medium 203 is configured to absorb heat emitted by the to-be-cooled load 103. After the second cooling medium 203 absorbs the heat emitted by the to-be-cooled load 103, a temperature of the second cooling medium 203 increases. Because the heat exchange capsule 13 is immersed in the first cooling medium 201 in the liquid storage vessel 11, the first cooling medium 201 exchanges heat with the second cooling medium 203, a temperature of the first cooling medium 201 increases, and the temperature of the second cooling medium 203 decreases, that is, the first cooling medium 201 cools and dissipates heat for the second cooling medium 203. When the second cooling medium 203 cools and dissipates heat for the to-be-cooled load 103, the first cooling medium 201 cools the second cooling medium 203, thereby helping improve cooling efficiency of the cooling system 101.

Because the liquid cooling module unit 10 is a modular design, when the data center 100 needs to be constructed, it is only necessary to directly transport the liquid cooling module unit 10 to a selected address to perform simple pipeline connection, thereby effectively shortening a deployment period. When the cooling system 101 and the data center 100 need to be scaled down or scaled up, it is only necessary to reduce or increase a quantity of liquid cooling module units 10.

The heat exchange capsule 13 includes a capsule body and a connection interface disposed in the capsule body. The capsule body is configured to store the second cooling medium 203. In this implementation, the first cooling medium 201 includes but is not limited to cooling water, and the second cooling medium 203 includes but is not limited to fluorinated liquid. The fluorinated liquid has inert features: insulated and non-flammable, and is usually applied to a data center for liquid cooling. The connection interface may be disposed on an inner wall of the capsule body, and is configured to be connected to the to-be-cooled load 103. The connection interface includes a communication interface, a power supply terminal, and the like, to help implement functions such as power supply and communication of the to-be-cooled load 103.

In this implementation, there are a plurality of liquid cooling module units 10, there are a plurality of heat exchange capsules 13 in each liquid cooling module unit 10, and the plurality of heat exchange capsules 13 may be evenly and orderly arranged in a liquid storage vessel 11. For example, a plurality of heat exchange capsules 13 in one liquid cooling module unit 10 are spaced apart in a straight line. Each heat exchange capsule 13 can accommodate one to-be-cooled load 103. A plurality of to-be-cooled loads 103 are respectively placed in a plurality of heat exchange capsules 13, thereby reducing a usage amount of the second cooling medium 203, and also improving cooling and heat dissipation efficiency of the cooling system 101.

It may be understood that, in another implementation, there may be one or more heat exchange capsules 13 in each liquid cooling module unit 10, and there may be one or more to-be-cooled loads 103 in the heat exchange capsule 13.

The recycling unit 30 is connected to the liquid outlet 113 of the liquid storage vessel 11 by using a pipeline, to transport the first cooling medium 201 to the recycling unit 30 for recycling. The recycling unit 30 is connected to the liquid outlet 113 of the liquid storage vessel 11 by using the pipeline.

In this implementation, the recycling unit 30 is a recycling vessel. The recycling unit 30 includes a heat storage region 31 and a cold storage region 33 that are separately disposed. For example, an inner cavity of the recycling vessel is physically separated by using a separator, to form the heat storage region 31 and the cold storage region 33. The heat storage region 31 is connected to the liquid outlet 113 of the liquid storage vessel 11 by using the pipeline, and the heat storage region 31 is configured to store the first cooling medium 201 flowing out of the liquid outlet 113 of the liquid storage vessel 11. The cold storage region 33 is connected to the liquid inlet 111 of the liquid storage vessel 11 by using a pipeline. The cold storage region 33 is configured to store a first cooling medium 201, and is configured to supplement the liquid storage vessel 11 with the first cooling medium 201. A temperature of the first cooling medium in the heat storage region 31 is higher than a temperature of the first cooling medium in the cold storage region 33. In other words, the heat storage region 31 is a heat storage region, and the cold storage region 33 is a cold storage region. A thermal insulation material is disposed on inner walls and/or outer walls of the heat storage region 31 and the cold storage region 33, and the thermal insulation material can perform thermal insulation storage on the first cooling medium 201 in the heat storage region 31.

The first cooling medium 201 flowing out of the liquid outlet 113 of the liquid storage vessel 11 becomes a hot first cooling medium 201 due to a temperature increase caused by heat exchange with the second cooling medium 203. The "hot first cooling medium" herein is merely described relative to a first cooling medium 201 existing before heat exchange with the second cooling medium 203. It may be understood that a temperature of the hot first cooling medium is not limited. The heat storage region 31 stores the first cooling medium 201 flowing out of the liquid outlet 113 of the liquid storage vessel 11, so that excess heat of the liquid cooling module unit 10 can be effectively recycled, thereby saving energy.

The heat storage region 31 and the cold storage region 33 are stacked in a height direction of the recycling unit 30. The cold storage region 33 is located at a bottom of the recycling unit 30. The heat storage region 31 includes a liquid inlet 311 and a liquid outlet 313. The liquid inlet 311 of the heat storage region 31 is connected to the liquid outlet 113 of the liquid storage vessel 11. The liquid outlet 313 of the heat storage region 31 is located at an end that is of the heat storage region 31 and that is away from the cold storage region 33. A valve 34 is disposed at the liquid outlet 313 of the heat storage region 31 and is configured to open or close the liquid outlet 313 of the heat storage region 31, thereby facilitating obtaining of the hot first cooling medium 201.

The first cooling medium 201 is layered with temperatures in a height direction of the beat storage region 31. For example, a first cooling medium 201 with a highest temperature is located at an uppermost layer. The liquid outlet 313 is disposed at a relatively high position in the height direction of the heat storage region 31, so that a first cooling medium 201 flowing out of the liquid outlet 313 always keeps at an optimal heat recycling temperature.

A liquid outlet 331 is disposed in the cold storage region 33. The liquid outlet 331 is connected to the liquid inlet 111 of the liquid storage vessel 11 by using the pipeline. The heat storage region 31 for heat storage and the cold storage region 33 for cold storage are disposed in the same vessel, thereby simplifying a structure of the cooling system 101. The heat storage region 31 and the cold storage region 33 are stacked in the height direction of the recycling unit 30, thereby effectively reducing a floor area of the recycling unit 30, and improving space utilization of the cooling system 101.

It may be understood that, in another implementation, the heat storage region 31 and the cold storage region 33 of the recycling unit 30 may not be stacked in the height direction of the recycling unit 30, provided that the heat storage region 31 and the cold storage region 33 are separated. For example, the recycling unit 30 includes a first vessel and a second vessel, the first vessel includes the heat storage region 31, and the second vessel includes the cold storage region 33.

The recycling unit 30 further includes a bypass component 35 connected between the beat storage region 31 and the cold storage region 33. When the bypass component 35 is opened, the heat storage region 31 can transport the first cooling medium 201 to the cold storage region 33, to adjust the temperature of the first cooling medium 201 in the cold storage region 33.

The cooling system 101 further includes a pump 50 disposed on the pipeline between the recycling unit 30 and the liquid storage vessel 11, and the pump 50 is configured to drive the first cooling medium 201 to circulate in a loop, thereby reducing a usage amount of the first cooling medium 201.

The cooling system 101 further includes a control unit 70, and the control unit 70 is electrically connected to the connection interface, so that the control unit 70 establishes a communication connection and an electrical connection to the to-be-cooled load 103, thereby facilitating power distribution and monitoring of the to-be-cooled load 103. The control unit 70 is communicatively connected to the pump 50 and is configured to control the pump 50. It may be understood that the recycling unit 30 may be directly connected to the liquid storage vessel 11.

According to the cooling system 101 and the data center 100 provided in this application, the liquid cooling module unit 10 is a modular design, thereby facilitating transportation. Therefore, flexibility of distributed deployment is improved, and nearly half time is estimated to be saved for a deployment period compared with a conventional data center. In addition, a single-phase/two-phase immersion solution is compatible, and transportation costs can be greatly reduced due to a modular structure. In the single-phase immersion solution, for example, both the first cooling medium 201 and the second cooling medium 203 are liquid in a working process. In the two-phase immersion solution, for example, the second cooling medium 203 may be converted between a vapor phase and a liquid phase in a working process. An indoor/outdoor solution may be selected based on an application scenario. A heat exchange path is extremely short, and heat exchange efficiency is high. The second cooling medium 203 in the heat exchange vessel 13 does not need a pump, peak power consumption is low, a power output rate of the data center is high, and a power density of a supported device (load) is higher. A filling amount of the second cooling medium (for example, fluorinated liquid) can be greatly reduced through distributed design.

Figure 3:
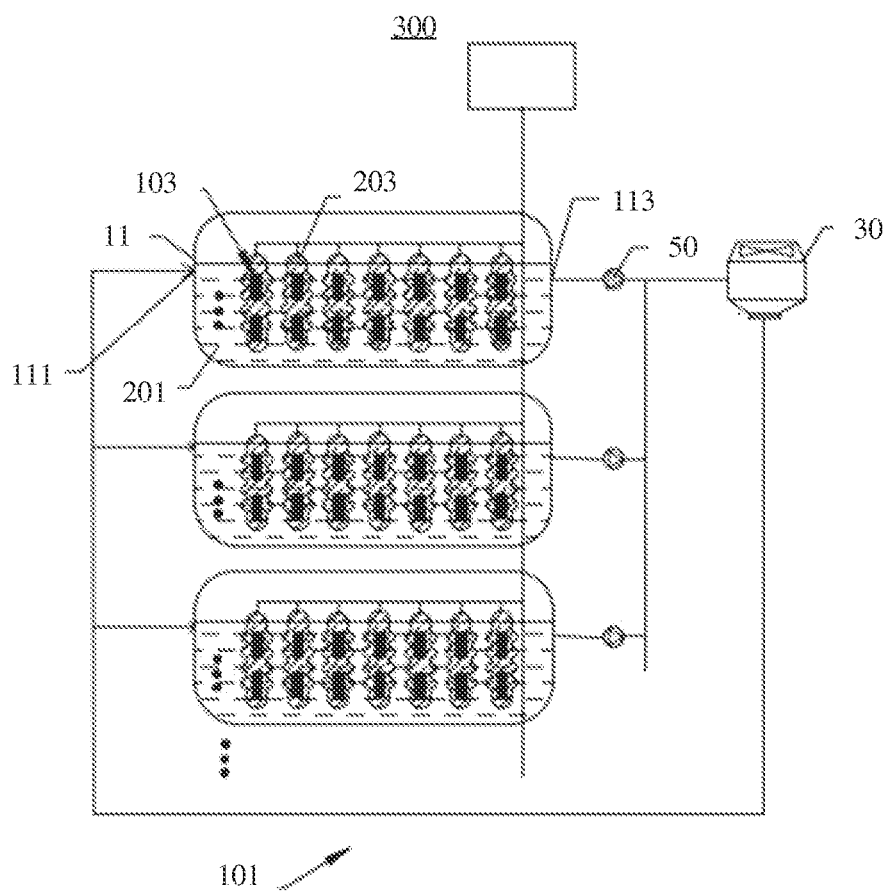
FIG. 3 is a schematic diagram of a data center according to a second implementation of this application.

Referring to FIG. 3, a second implementation of this application provides a data center 300, having a substantially same structure as the data center 100 provided in the first implementation. A difference lies in a structure of a recycling unit 30.

In this implementation, the recycling unit 30 includes a cooling tower or a dry cooler. The recycling unit 30 is connected to a liquid outlet 113 of a liquid storage vessel 11 by using a pipeline, and the recycling unit 30 is connected to a liquid inlet 111 of the liquid storage vessel 11 by using a pipeline. A first cooling medium 201 flowing out of the liquid outlet 113 of the liquid storage vessel 11 is transported to the recycling unit 30 for recycling and cooling. A first cooling medium 201 obtained after the recycling unit 30 performs cooling is transported to the liquid storage vessel 11. In this way, a liquid cooling module unit and the recycling unit 30 form a circulation loop of the first cooling medium 201, to implement cyclical usage of the first cooling medium 201.

The cooling system 101 further includes a pump 50 disposed on the pipeline between the recycling unit 30 and the liquid storage vessel 11, and the pump 50 is configured to drive the first cooling medium 201 to circulate in the loop, thereby reducing a usage amount of the first cooling medium 201.

It should be understood that the expressions such as "include" and "may include" that can be used in this application represent existence of disclosed functions, operations, or constituent elements, and are not limited to one or more additional functions, operations, or constituent elements. In this application, the terms such as "include" and/or "have" can be construed as representing a particular feature, quantity, operation, constituent element, component, or a combination thereof, but cannot be construed as excluding existence or addition possibility of one or more other features, quantities, operations, constituent elements, components, or combinations thereof.

In addition, in this application, the expression "and/or" includes any and all combinations of associated listed words. For example, the expression "A and/or B" may include A, may include B, or may include both A and B.

In this application, the expressions including ordinal numbers such as "first" and "second" may modify elements. However, the elements are not limited by the expressions. For example, the expressions do not limit an order and/or importance of the elements. The expressions are only used to distinguish an element from another element. For example, first user equipment and second user equipment indicate different user equipment, although both the first user equipment and the second user equipment are user equipment. Similarly, without departing from the scope of this application, a first element may be referred to as a second element, and similarly, a second element may be referred to as a first element.

When a component is referred to as "being connected to" or "accessing" another component, it should be understood that the component may be directly connected to or access the another component, or there may be another component between the component and the another component. In addition, when a component is referred to as "being directly connected to" or "directly accessing" another component, it should be understood that there is no component between the component and the another component.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A cooling system, comprising:
at least one liquid cooling module unit, wherein each liquid cooling module unit of the at least one liquid cooling module unit comprises:
a liquid storage vessel; and
a heat exchange capsule comprising a capsule body and an interface disposed in the capsule body;
wherein the liquid storage vessel is configured to store a first cooling medium, wherein the heat exchange capsule is disposed in the liquid storage vessel, wherein at least a part of the heat exchange capsule is arranged to be immersed, in use, in the first cooling medium, wherein the capsule body of the heat exchange capsule of each liquid cooling module unit of the at least one liquid cooling module unit is configured to store a second cooling medium, wherein the first cooling medium is configured to exchange heat with the second cooling medium, and wherein the interface of the heat exchange capsule of each liquid cooling module unit is configured to be electrically connected to a load immersed in the second cooling medium of a respective capsule body.

2. The cooling system according to claim 1, wherein the cooling system further comprises a control unit, and the control unit is electrically connected to the interface.

3. The cooling system according to claim 1, wherein the cooling system further comprises a recycling unit, and wherein the recycling unit is connected to the liquid storage vessel by a pipeline and is configured to recycle the first cooling medium as the first cooling medium flows out of the liquid storage vessel.

4. The cooling system according to claim 3, wherein the liquid storage vessel of each liquid cooling module unit of the at least one liquid cooling module unit comprises a liquid inlet and a liquid outlet, wherein the recycling unit comprises a heat storage region and a cold storage region that are separately disposed, wherein the heat storage region is connected to the liquid outlet of the liquid storage vessel by a pipeline, wherein the heat storage region is configured to store the first cooling medium that flows out of the liquid outlet of the liquid storage vessel, wherein the cold storage region is connected to the liquid inlet of the liquid storage vessel by a pipeline, the cold storage region is configured to store the first cooling medium, and wherein a temperature of the first cooling medium in the heat storage region during operation is higher than a temperature of the first cooling medium in the cold storage region.

5. The cooling system according to claim 4, wherein the recycling unit is a recycling vessel, wherein the heat storage region and the cold storage region are disposed in a height direction of the recycling vessel, and wherein the cold storage region is located at a bottom of the recycling vessel.

6. The cooling system according to claim 5, wherein the heat storage region comprises a liquid inlet and a liquid outlet, wherein the liquid inlet of the heat storage region is connected to the liquid outlet of the liquid storage vessel, wherein the liquid outlet of the heat storage region is located at an end of the heat storage region that is away from the cold storage region, and wherein a valve is disposed at the liquid outlet of the heat storage region and is configured to open or close the liquid outlet of the heat storage region.

7. The cooling system according to claim 4, wherein the recycling unit further comprises a bypass component disposed between the heat storage region and the cold storage region, and wherein the bypass component is configured to transport the first cooling medium in the heat storage region to the cold storage region.

8. The cooling system according to claim 5, wherein the recycling unit further comprises a bypass component disposed between the heat storage region and the cold storage region, and wherein the bypass component is configured to transport the first cooling medium in the heat storage region to the cold storage region.

9. The cooling system according to claim 6, wherein the recycling unit further comprises a bypass component disposed between the heat storage region and the cold storage region, and wherein the bypass component is configured to transport the first cooling medium in the heat storage region to the cold storage region.

10. The cooling system according to claim 3, wherein the liquid storage vessel comprises a liquid inlet and a liquid outlet, wherein the recycling unit comprises at least one of a cooling tower or a dry cooler, wherein the recycling unit is connected to the liquid inlet of the liquid storage vessel, wherein the recycling unit is connected to the liquid outlet of the liquid storage vessel, and wherein the recycling unit is configured to cool the first cooling medium that flows out of the liquid outlet of the liquid storage vessel, and is further configured to transport a cooled first cooling medium to the liquid storage vessel from the liquid inlet of the liquid storage vessel.

11. The cooling system according to claim 3, wherein the cooling system further comprises a pump disposed on the pipeline between the recycling unit and the liquid storage vessel, and wherein the pump is configured to drive the first cooling medium in the liquid storage vessel to the recycling unit.

12. A data center, comprising:
a cooling system; and
a load;
wherein the cooling system comprises at least one liquid cooling module unit, wherein each liquid cooling module unit of the at least one liquid cooling module unit comprises a liquid storage vessel and a heat exchange capsule, wherein the liquid storage vessel is configured to store a first cooling medium, wherein the heat exchange capsule is disposed in the liquid storage vessel, wherein the heat exchange capsule comprises a capsule body and an interface disposed in the capsule body, wherein at least a part of the heat exchange capsule is arranged to be immersed, in use, in the first cooling medium, wherein the heat exchange capsule is configured to store a second cooling medium in the capsule body, and wherein the first cooling medium is configured to exchange heat with the second cooling medium; and
wherein the load is accommodated in the heat exchange capsule and is arranged to be immersed in the second cooling medium during use, and wherein the interface is electrically connected to the load.

13. The data center according to claim 12, wherein the cooling system further comprises a recycling unit connected to the liquid storage vessel by a first pipeline, wherein the recycling unit is configured to recycle the first cooling medium.

14. The data center according to claim 13, wherein the liquid storage vessel comprises a liquid inlet and a liquid outlet, wherein the recycling unit comprises a heat storage region and a cold storage region that are separately disposed, wherein the heat storage region is connected to the liquid outlet of the liquid storage vessel by a second pipeline, wherein the heat storage region stores the first cooling medium, wherein the cold storage region is connected to the liquid inlet of the liquid storage vessel by a third pipeline, wherein the cold storage region stores the first cooling medium.

15. A cooling system, comprising:
   a liquid cooling module unit, comprising:
      a liquid storage vessel; and
      a heat exchange capsule, disposed in the liquid storage vessel, wherein the heat exchange capsule comprises a capsule body and an interface disposed in the capsule body;
   wherein a first cooling medium is stored in the liquid storage vessel;
   wherein at least a part of the heat exchange capsule is immersed in the first cooling medium; and
   wherein a second cooling medium is stored in the capsule body of the heat exchange capsule such that the heat exchange capsule exchanges heat between the first cooling medium and the second cooling medium, and wherein the interface is electrically connected to a load immersed in the second cooling medium.

16. The cooling system according to claim 15, wherein the cooling system further comprises a recycling unit connected to the liquid storage vessel by a pipeline, wherein the recycling unit is configured to recycle the first cooling medium.

17. The cooling system according to claim 16, wherein the liquid storage vessel comprises a liquid inlet and a liquid outlet, wherein the recycling unit comprises a heat storage region and a cold storage region that are separately disposed, wherein the heat storage region is connected to the liquid outlet of the liquid storage vessel by a second pipeline, wherein the heat storage region stores the first cooling medium, wherein the cold storage region is connected to the liquid inlet of the liquid storage vessel by a third pipeline, wherein the cold storage region stores the first cooling medium.

* * * * *